United States Patent
Tay et al.

(10) Patent No.: US 8,921,983 B2
(45) Date of Patent: Dec. 30, 2014

(54) SEMICONDUCTOR PACKAGE AND METHOD OF FORMING SIMILAR STRUCTURE FOR TOP AND BOTTOM BONDING PADS

(75) Inventors: Lionel Chien Hui Tay, Singapore (SG);
Henry D. Bathan, Singapore (SG);
Zigmund R. Camacho, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 170 days.

(21) Appl. No.: 13/235,413

(22) Filed: Sep. 18, 2011

(65) Prior Publication Data

US 2012/0001326 A1  Jan. 5, 2012

Related U.S. Application Data (62) Division of application No. 11/952,502, filed on Dec. 7, 2007, now Pat. No. 8,039,302.

(51) Int. Cl.
*H01L 25/10* (2006.01)
*H01L 25/065* (2006.01)
(Continued)

(52) U.S. Cl.
CPC ... *H01L 23/5389* (2013.01); *H01L 2924/15311* (2013.01); *H01L 2924/19107* (2013.01); *H01L 2924/01074* (2013.01); *H01L 2224/2919* (2013.01); *H01L 24/16* (2013.01); *H01L 2924/01033* (2013.01); *H01L 23/3128* (2013.01); *H01L 2224/18* (2013.01); *H01L 24/82* (2013.01); *H01L 2224/73204* (2013.01);
(Continued)

(58) Field of Classification Search
None
See application file for complete search history.

(56) References Cited

U.S. PATENT DOCUMENTS

7,022,399 B2  4/2006  Ogawa et al.
2002/0117743 A1*  8/2002  Nakatani et al. ............ 257/687
(Continued)

*Primary Examiner* — Sonya D McCall Shepard
(74) *Attorney, Agent, or Firm* — Robert D. Atkins; Patent Law Group: Atkins and Associates, P.C.

(57) ABSTRACT

A semiconductor device includes a first semiconductor die. A plurality of conductive vias is formed around the first semiconductor die. A first conductive layer is formed over a first surface of the first semiconductor die and electrically connects to the plurality of conductive vias. A second conductive layer is formed over a second surface of the first semiconductor die opposite the first surface and electrically connects to the plurality of conductive vias. A first passivation layer is formed over the first surface and includes openings that expose the first conductive layer. A second passivation layer is formed over the second surface and includes openings that expose the second conductive layer. Bonding pads are formed within the openings in the first and second passivation layers and are electrically connected to the first and second conductive layers. An interconnect structure is disposed within the openings in the first and second passivation layers.

20 Claims, 10 Drawing Sheets

(51) Int. Cl.
*H01L 23/538* (2006.01)
*H01L 21/683* (2006.01)
*H01L 23/00* (2006.01)
*H01L 23/31* (2006.01)
*H01L 23/495* (2006.01)

(52) U.S. Cl.
CPC .......... H01L 2225/1058 (2013.01); *H01L 2924/01047* (2013.01); H01L 2225/06524 (2013.01); H01L 2924/01006 (2013.01); H01L 2224/81801 (2013.01); H01L 2924/30105 (2013.01); H01L 2924/014 (2013.01); *H01L 25/105* (2013.01); *H01L 25/0657* (2013.01); H01L 2924/01029 (2013.01); H01L 23/4951 (2013.01); *H01L 24/96* (2013.01); *H01L 24/81* (2013.01); *H01L 24/18* (2013.01); H01L 2924/01073 (2013.01); H01L 2924/01013 (2013.01); H01L 2924/01024 (2013.01); H01L 2224/16225 (2013.01); H01L 2924/01079 (2013.01); H01L 2924/15331 (2013.01); H01L 2924/0104 (2013.01); *H01L 21/6835* (2013.01); H01L 2224/32225 (2013.01); H01L 2924/0105 (2013.01); H01L 2924/04941 (2013.01); H01L 2924/01023 (2013.01); H01L 2924/01078 (2013.01); H01L 23/49575 (2013.01); H01L 2225/1035 (2013.01); H01L 2924/01082 (2013.01)
USPC .......... 257/621; 257/778; 257/E23.007; 257/E21.001; 438/106

(56) References Cited

U.S. PATENT DOCUMENTS

| | | |
|---|---|---|
| 2004/0195686 A1* | 10/2004 | Jobetto et al. .............. 257/734 |
| 2005/0104181 A1* | 5/2005 | Lee et al. .............. 257/686 |
| 2006/0050486 A1 | 3/2006 | Lee et al. |
| 2006/0170098 A1* | 8/2006 | Hsu .............. 257/723 |
| 2007/0007641 A1 | 1/2007 | Lee et al. |
| 2007/0035015 A1* | 2/2007 | Hsu .............. 257/723 |
| 2007/0085188 A1* | 4/2007 | Chang et al. .............. 257/686 |
| 2008/0105984 A1 | 5/2008 | Lee |

* cited by examiner

SEMICONDUCTOR PACKAGE AND METHOD OF FORMING SIMILAR STRUCTURE FOR TOP AND BOTTOM BONDING PADS

CLAIM TO DOMESTIC PRIORITY

The present application is a division of U.S. patent application Ser. No. 11/952,502, now U.S. Pat. No. 8,039,302, filed Dec. 7, 2007, and claims priority to the foregoing parent application pursuant to 35 U.S.C. §121.

FIELD OF THE INVENTION

The present invention relates in general to semiconductor packages and, more particularly, to a semiconductor device having similar structure for top and bottom bonding pads.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to stack semiconductor packages for a higher level of device integration. In prior stacking arrangements, the semiconductor package interconnects have used through hole vias, solder bumps, and wire bonding. Space must be allocated to the stacking arrangement when using bond wires. Also, the bond wires are typically made with gold, which adds cost to the manufacturing process. The formation of through hole vias also adds manufacturing cost. The solder bumps for different packages are often dissimilar and proper orientation to contact pads on adjacent packages must be taken into account in the stacking design.

SUMMARY OF THE INVENTION

In one embodiment, the present invention is a semiconductor device comprising a first semiconductor die. A plurality of conductive vias is formed around the first semiconductor die. A first conductive layer is formed over a first surface of the first semiconductor die and electrically connects to the plurality of conductive vias. A second conductive layer is formed over a second surface of the first semiconductor die opposite the first surface and electrically connects to the plurality of conductive vias. A first passivation layer is formed over the first surface and includes openings that expose the first conductive layer. A second passivation layer is formed over the second surface and includes openings that expose the second conductive layer. Bonding pads are formed within the openings in the first and second passivation layers and are electrically connected to the first and second conductive layers. An interconnect structure is disposed within the openings in the first and second passivation layers.

In another embodiment, the present invention is a semiconductor device comprising a first semiconductor die. A plurality of conductive vias is formed around the first semiconductor die. A first conductive layer is formed over a first surface of the first semiconductor die and electrically connects to the plurality of conductive vias. A second conductive layer is formed over a second surface of the first semiconductor die opposite the first surface and electrically connects to the plurality of conductive vias. A first passivation layer is formed over the first surface and includes openings that expose the first conductive layer. A second passivation layer is formed over the second surface and includes openings that expose the second conductive layer. Bonding pads are formed within and follow a contour of the openings in the first and second passivation layers and electrically connect to the first and second conductive layers.

In another embodiment, the present invention is a semiconductor device comprising a first semiconductor die. A plurality of conductive vias is formed around the first semiconductor die. A first conductive layer is formed over a first surface of the first semiconductor die and electrically connects to the plurality of conductive vias. A second conductive layer is formed over a second surface of the first semiconductor die opposite the first surface and electrically connects to the plurality of conductive vias. A first passivation layer is formed over the first surface and includes openings that expose the first conductive layer. A second passivation layer is formed over the second surface and includes openings that expose the second conductive layer. Bonding pads are formed within the openings in the first and second passivation layers and are aligned and electrically connected to the first and second conductive layers.

In another embodiment, the present invention is a semiconductor device comprising a first semiconductor die. A plurality of conductive vias is formed around the first semiconductor die. A first conductive layer is formed over a first surface of the first semiconductor die and electrically connects to the plurality of conductive vias. A second conductive layer is formed over a second surface of the first semiconductor die opposite the first surface and electrically connects to the plurality of conductive vias. A first passivation layer is formed over the first surface and includes openings that expose the first conductive layer. A second passivation layer is formed over the second surface and includes openings that expose the second conductive layer. Bonding pads are formed within the openings in the first and second passivation layers and electrically connect to the first and second conductive layers.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
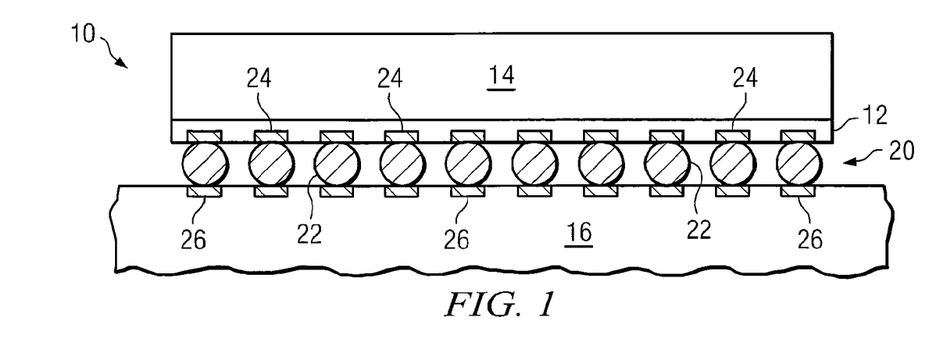
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Figure 2A:
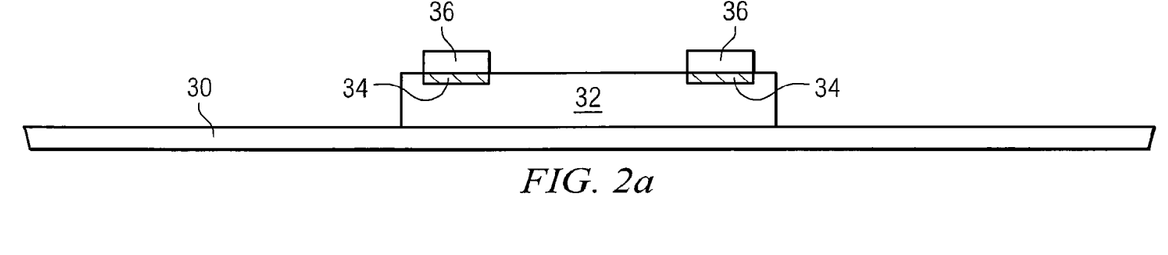
FIGS. 2a-2g illustrate a semiconductor package having similar structure for top and bottom bond pads.

FIGS. 2a-2g illustrate formation of a semiconductor package having similar structure for top and bottom bond pads for use with WLCSP or other semiconductor devices. FIG. 2a shows a thin insulating sheet or substrate 30. Substrate 30 can be made with silicon nitride (SixNy), silicon dioxide (SiO2), silicon oxynitride (SiON), tantalum pentoxide (Ta2O5), Zirconium (Zr) oxide, polyimide (PI), or other dielectric material. The deposition of substrate 30 may involve physical vapor deposition (PVD) or chemical vapor deposition (CVD) with a thickness sufficient to electrically insulate the die and minimize noise between the die and other conductive components such as redistribution layers (RDLs). In an alternative embodiment, substrate 30 is at least approximately 5 µm thick.

A semiconductor die 32 is mounted on substrate 30 with a die attach adhesive such as thermal epoxy. Semiconductor die 32 has active and passive devices, conductive layers, and dielectric layers on its active surface according to the electrical design of the die. Semiconductor die 32 further includes contact pads 34 for routing signals to the circuits in the die. A photoresist material 36 is patterned and deposited on contact pads 34.

Figure 2B:
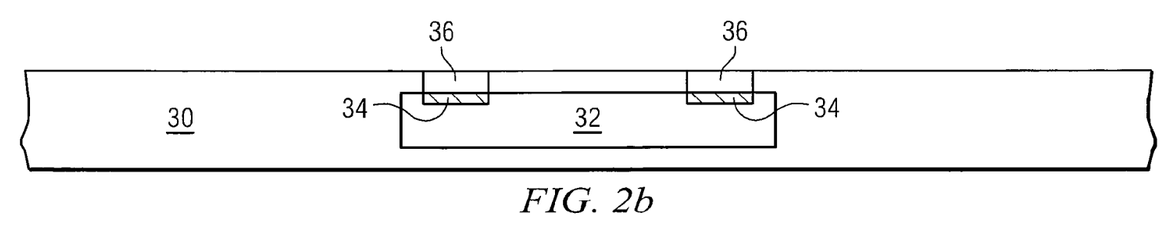
Figure 2C:
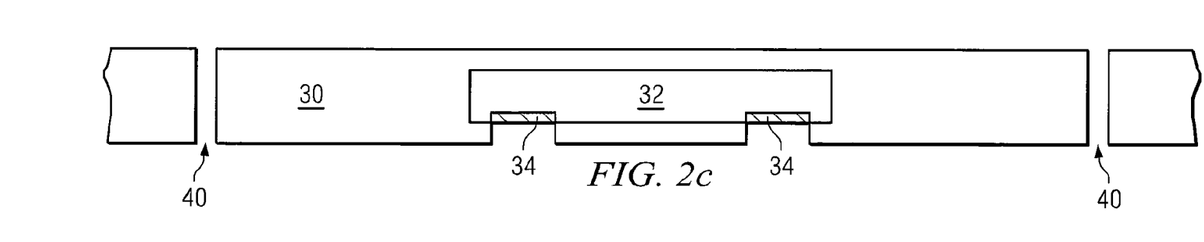

In FIG. 2b, additional insulating material 30 is deposited to enclose semiconductor die 32. In FIG. 2c, the structure is inverted. Photoresist 36 is removed to expose contact pads 34. Vias 40 are formed through substrate 30.

Figure 2D:
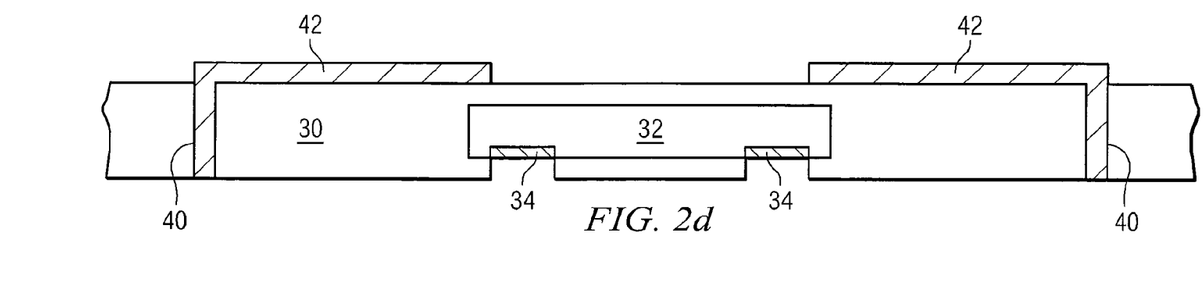

In FIG. 2d, vias 40 are filled with conductive material such as aluminum (Al), copper (Cu), tin (Sn), nickel (Ni), gold (Au), and silver (Ag). An RDL 42 is deposited over a bottom surface of substrate 30 using a patterning and deposition process. RDLs 42 can be made with Al, Ni, nickel vanadium (NiV), Cu, or Cu alloy. RDLs 42 can be made by an electrolytic plating or electroless plating process. RDLs 42 can be made with a single layer, or multiple layers using an adhesion layer of titanium (Ti), titanium tungsten (TiW), or chromium (Cr). RDLs 42 operate as an intermediate conduction layer or interconnect formed over the bottom surface of substrate 30 in electrical contact with conductive vias 40 to route electrical signals to semiconductor die 32.

Figure 2E:
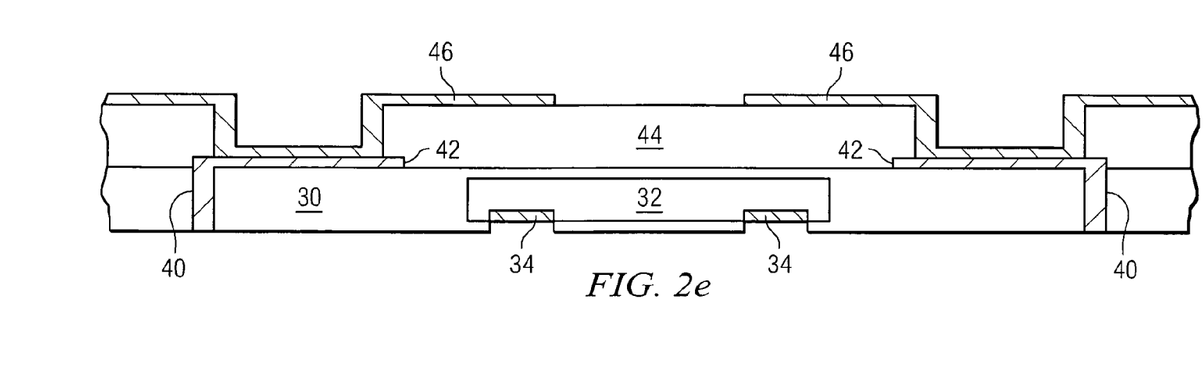

In FIG. 2e, a passivation layer 44 is formed over substrate 30 for structural support and physical isolation. Passivation layer 44 can have one or more layers of SixNy, SiO2, SiON, PI, benzocyclobutene (BCB), polybenzoxazole (PBO), WPR, epoxy, or other insulating material. A portion of passivation layer 44 is removed using a mask-defined etching process to expose RDLs 42. A metal layer 46 is deposited over passivation layer 44 and RDLs 42 by an evaporation, electrolytic plating, electroless plating, or screen printing process. Metal layer 46 is an under bump metallization (UBM) layer or bonding pad. UBM 46 can be made with Ti, Ni, NiV, Cu, or Cu alloy. UBMs 46 can be a multiple metal stack with adhesion layer, barrier layer, and wetting layer. The adhesion layer is made with Ti, Cr, Al, TiW, or titanium nitride (TiN). The barrier layer can be made with Ni, NiV, CrCu, or TiW. The wetting layer can be made with Cu, Au, or Ag. UBMs 46 can be electroless Ni or Au on RDLs 42 for both solder bumps and wire bonding.

In FIG. 2f, the package is again inverted. RDLs 48 are deposited over a top surface of substrate 30, opposite the bottom surface of substrate 30, using a patterning and deposition process. RDLs 48 can be made with Al, Ni, NiV, Cu, or Cu alloy. RDLs 48 can be made by an electrolytic plating or electroless plating process. RDLs 48 can be made with a single layer, or multiple layers using an adhesion layer of Ti, TiW, or Cr. RDLs 48 operate as an intermediate conduction layer or interconnect formed over the top surface of substrate 30 in electrical contact with conductive vias 40 to route electrical signals to semiconductor die 32.

Figure 2F:
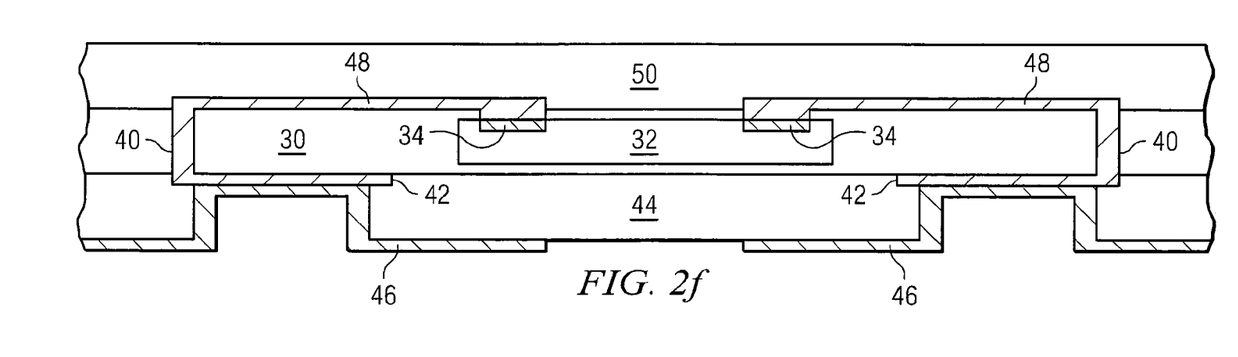

A passivation layer 50 is formed over substrate 30 and RDLs 48 for structural support and physical isolation. Passivation layer 50 can have one or more layers of SixNy, SiO2, SiON, PI, BCB, PBO, WPR, epoxy, or other insulating material.

Figure 2G:
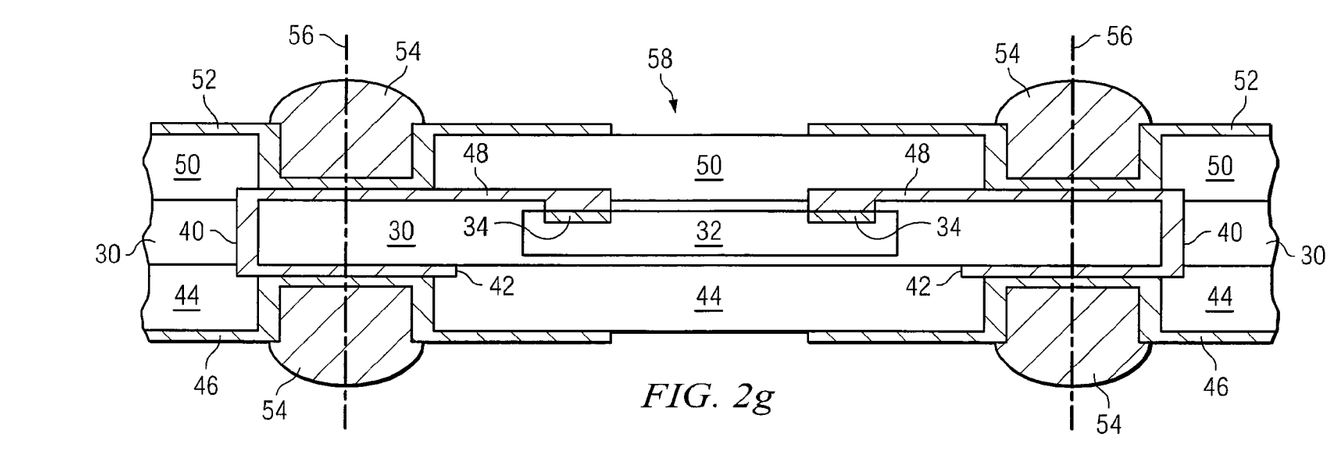

In FIG. 2g, a portion of passivation layer 50 is removed using a mask-defined etching process to expose RDLs 48. A metal layer 52 is deposited over passivation layer 50 and RDLs 48 by an evaporation, electrolytic plating, electroless plating, or screen printing process. Metal layer 52 is a UBM layer or bonding pad. UBM 52 can be made with Ti, Ni, NiV, Cu, or Cu alloy. UBMs 52 can be a multiple metal stack with adhesion layer, barrier layer, and wetting layer. The adhesion layer is made with Ti, Cr, Al, TiW, or TiN. The barrier layer can be made with Ni, NiV, CrCu, or TiW. The wetting layer can be made with Cu, Au, or Ag. UBMs 52 can be electroless Ni or Au on RDLs 48 for both solder bumps and wire bonding.

An electrically conductive solder material is deposited over UBMs 46 and 52 using an electrolytic plating or electroless plating process. The solder material can be any metal or electrically conductive material, e.g., Sn, lead (Pb), Ni, Au, Ag, Cu, bismuthinite (Bi) and alloys thereof. In one embodiment, the solder material is 63 percent weight of Sn and 37 percent weight of Pb. The solder material is reflowed by heating the conductive material above its melting point to form spherical balls or bumps 54. In one embodiment, solder bumps 54 are about 500 μm in height. In some applications, solder bumps 54 are reflowed a second time to improve electrical contact to the UBM structure.

The semiconductor package 58 shown in FIG. 2g has substantially similar top and bottom UBMs or bonding pads 46 and 52. The similar top and bottom UBMs or bonding pads allow the package to be stacked from either side. The solder bumps can vary in size. UBMs/bonding pads 46 and 52 may have no solder bump or wire bond formed on the pad. The top and bottom bonding pads 46 and 52 are positioned by proper selection of length of RDLs 42 and 48 such that a center area of the pads on opposite surfaces of the substrate is vertically aligned along lines 56. Contact pads 34 electrically connect to bonding pad 52 through RDLs 48. Contact pads 34 also electrically connect to bonding pads 46 through RDLs 48, conductive vias 40, and RDLs 42. RDLs 42 and 48 operate as intermediate conduction layers or interconnects to electrically connect bonding pads 46 and 52 through conductive vias 40 and route electrical signals to semiconductor die 32. The semiconductor package having substantially similar structure for top and bottom bonding pads allows for efficient stacking of semiconductor devices such as memory devices. The vertical alignment of the top and bottom bonding pads simplifies the stacking arrangement of the semiconductor packages. In addition, the semiconductor package 58 requires no wire bonding, spacers, film, or epoxy, which saves manufacturing costs.

Figure 3:
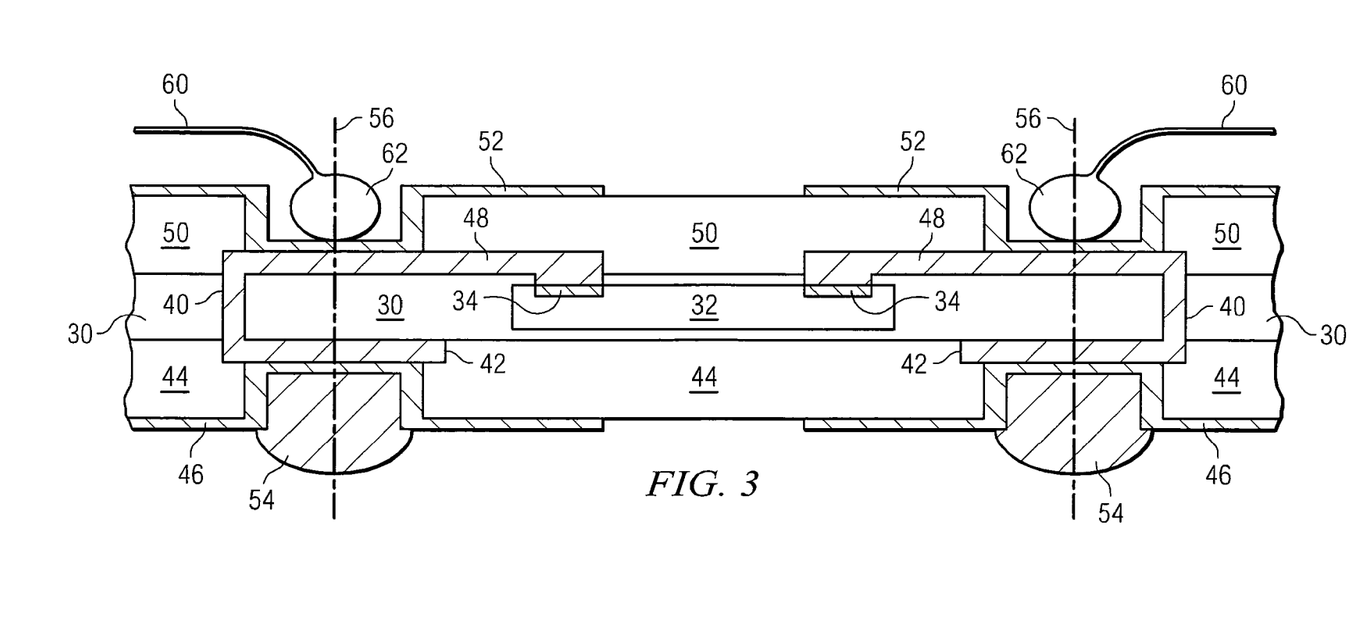
FIG. 3 illustrates wire bonds formed on the top bond pads.

FIG. 3 is a cross-sectional view of another embodiment of the semiconductor package having similar structure for top and bottom bond pads. As described in FIGS. 2a-2g, a thin insulating sheet or substrate 30 is provided. A semiconductor die 32 is mounted to substrate 30 with a die attach adhesive such as thermal epoxy. Semiconductor die 32 has active and passive devices, conductive layers, and dielectric layers on its active surface according to the electrical design of the die. Semiconductor die 32 further includes contact pads 34 for routing signals to the circuits in the die. A photoresist material 36 is patterned and deposited on contact pads 34. Additional insulating material 30 is deposited to enclose semiconductor die 32. Photoresist 36 is removed to expose contact pads 34. Vias 40 are formed through substrate 30. Vias 40 are filled with conductive material. RDL 42 is deposited over the bottom surface of substrate 30 using a patterning and deposition process. RDLs 42 operate as an intermediate conduction layer or interconnect in electrical contact with conductive vias 40 to route electrical signals to semiconductor die 32. A passivation layer 44 is formed over substrate 30 for structural support and physical isolation. A portion of passivation layer 44 is removed using a mask-defined etching process to expose RDLs 42. UBM 46 is deposited over passivation layer 44 and RDLs 42. RDLs 48 is deposited over the top surface of substrate 30 using a patterning and deposition process. RDLs 48 operate as an intermediate conduction layer or interconnect in electrical contact with conductive vias 40 to route electrical signals to semiconductor die 32. A passivation layer 50 is formed over substrate 30 and RDLs 48 for structural support and physical isolation. A portion of passivation layer 50 is removed using a mask-defined etching process to expose RDLs 48. UBM 52 is deposited over passivation layer 50 and RDLs 48. An electrically conductive solder material is deposited over UBMs 46 using an electrolytic plating or electroless plating process. The solder material is reflowed by heating the conductive material above its melting point to form spherical balls or bumps 54. Bond wires 60 are electrically connected to bonding pads 52 with wire bonds 62. Bond wire 60 can be made with Au.

The semiconductor package shown in FIG. 3 has substantially similar top and bottom UBMs or bonding pads 46 and 52. In this case, bond wires 60 connect to bonding pads 52, while solder bumps 54 are formed on UBMs 46. The top and bottom bonding pads 46 and 52 are positioned by proper selection of length of RDLs 42 and 48 such that a center area of the pads on opposite surfaces of substrate 30 is vertically aligned along lines 56.

Figure 4:
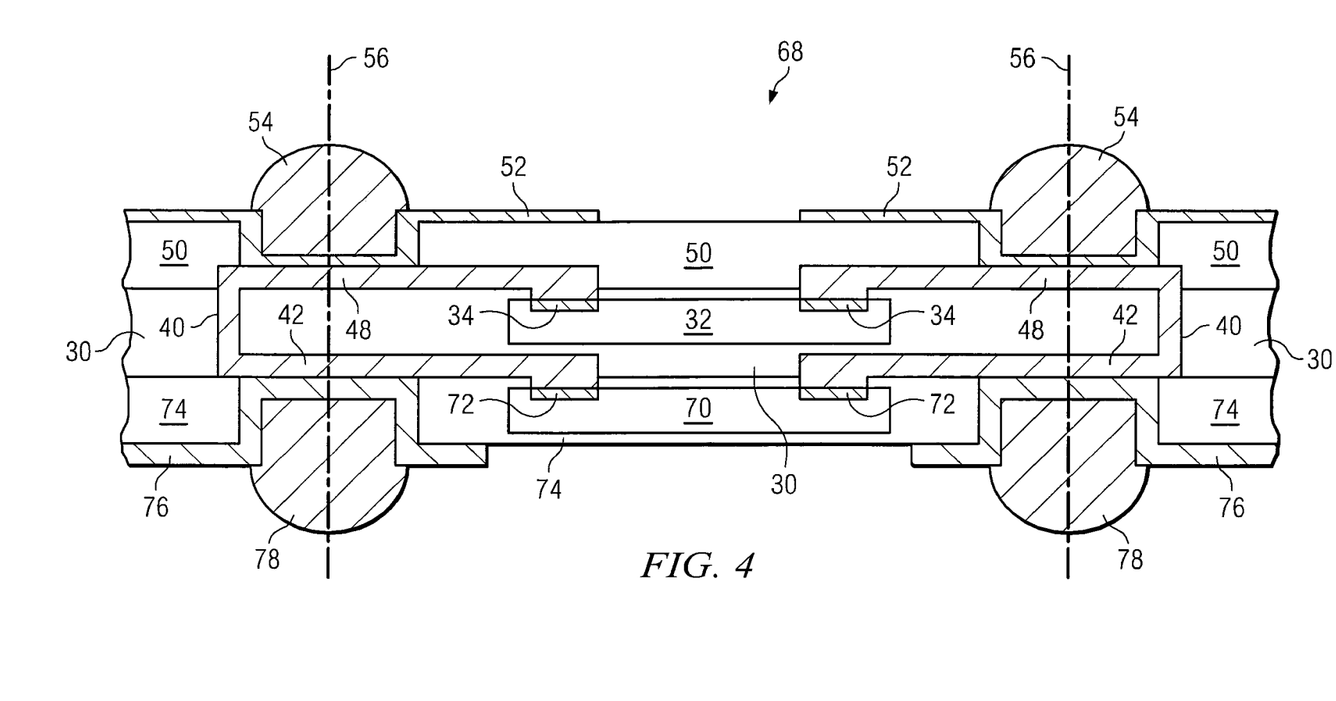
FIG. 4 illustrates the semiconductor package containing multiple semiconductor die.

Another embodiment of semiconductor package 68 is shown in FIG. 4. Similar to the description in FIGS. 2a-2g, a thin insulating sheet or substrate 30 is provided. A semiconductor die 32 is mounted to substrate 30 with a die attach adhesive such as thermal epoxy. Semiconductor die 32 has active and passive devices, conductive layers, and dielectric layers on its active surface according to the electrical design of the die. Semiconductor die 32 further includes contact pads 34 for routing signals to the circuits in the die. A photoresist material 36 is patterned and deposited on contact pads 34. Additional insulating material 30 is deposited to enclose semiconductor die 32. Photoresist 36 is removed to expose contact pads 34. Vias 40 are formed through substrate 30. Vias 40 are filled with conductive material. A portion of the bottom surface of substrate 30 is removed to form RDLs 42 using a patterning and deposition process. RDLs 42 operate as an intermediate conduction layer or interconnect in electrical contact with conductive vias 40 to route electrical signals to semiconductor die 32. RDL 48 is deposited over the top surface of substrate 30 using a patterning and deposition process. RDLs 48 operate as an intermediate conduction layer or interconnect in electrical contact with conductive vias 40 to route electrical signals to semiconductor die 32. A passivation layer 50 is formed over substrate 30 and RDLs 48 for structural support and physical isolation. A portion of passivation layer 50 is removed using a mask-defined etching process to expose RDLs 48. UBM 52 is deposited over passivation layer 50 and RDLs 48.

In the embodiment of FIG. 4, a semiconductor die 70 is mounted to substrate 30 with a die attach adhesive such as thermal epoxy. Semiconductor die 70 has active and passive devices, conductive layers, and dielectric layers on its active surface according to the electrical design of the die. Semiconductor die 70 further includes contact pads 72 for routing signals to the circuits in the die. Contacts pads 72 are electrically connected to RDLs 42. A passivation layer 74 is formed over substrate 30 and semiconductor die 70 for structural support and physical isolation. Passivation layer 74 can have one or more layers of SixNy, SiO2, SiON, PI, BCB, PBO, WPR, epoxy, or other insulating material. A portion of passivation layer 74 is removed using a mask-defined etching process to expose RDLs 42. A metal layer 76 is deposited over passivation layer 74 and RDLs 42 by an evaporation, electrolytic plating, electroless plating, or screen printing process. Metal layer 76 is a UBM layer or bonding pad. UBM 76 can be made with Ti, Ni, NiV, Cu, or Cu alloy. UBMs 76 can be a multiple metal stack with adhesion layer, barrier layer, and wetting layer. The adhesion layer is made with Ti, Cr, Al, TiW, or TiN. The barrier layer can be made with Ni, NiV, CrCu, or TiW. The wetting layer can be made with Cu, Au, or Ag.

An electrically conductive solder material is deposited over UBMs 52 and 76 using an electrolytic plating or electroless plating process. The solder material is reflowed by heating the conductive material above its melting point to form spherical balls or bumps 54 and 78. In one embodiment, solder bumps 54 and 78 are about 500 μm in height. In some applications, solder bumps 54 and 78 are reflowed a second time to improve electrical contact to the UBM structure.

The semiconductor package 68 shown in FIG. 4 has substantially similar top and bottom UBMs or bonding pads 46 and 52. In this case, multiple semiconductor die 32 and 70 are disposed within the package. The top and bottom UBM/bonding pads 46 and 52 are positioned by proper selection of length of RDLs 42 and 48 such that a center area of the pads on opposite surfaces of substrate 30 is vertically aligned along lines 56. Contact pads 34 of semiconductor die 32 electrically connect to bonding pad 52 through RDLs 48. Contact pads 34 also electrically connect to bonding pads 76 and further electrically connect to contact pads 72 of semiconductor die 70 through RDLs 48, conductive vias 40, and RDLs 42. RDLs 42 and 48 operate as an intermediate conduction layers or interconnects to electrically connect bonding pads 52 and 76 through conductive vias 40 and route electrical signals to semiconductor die 32 and 70. The vertical alignment of the top and bottom bonding pads simplifies the stacking arrangement of the semiconductor packages. In addition, the semiconductor package 68 requires no wire bonding, spacers, film, or epoxy, which saves manufacturing costs.

Figure 5:
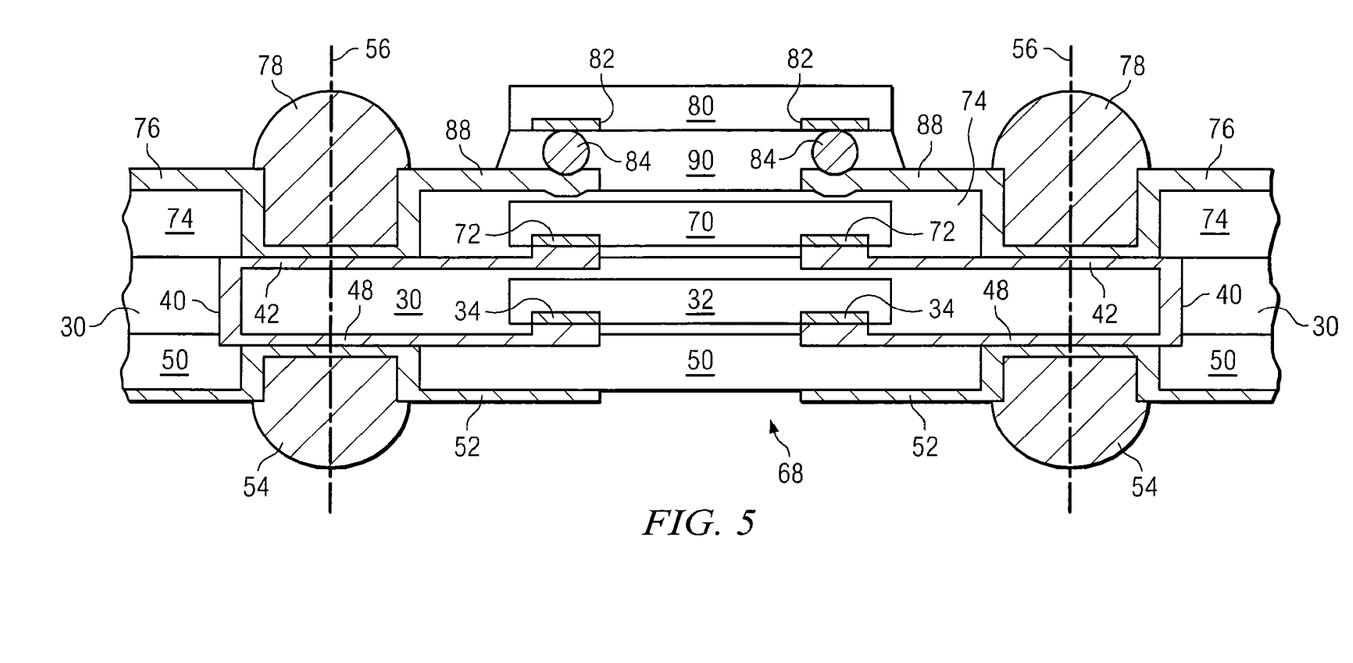
FIG. 5 illustrates a flip chip semiconductor die mounted on the semiconductor package.

In FIG. 5, the semiconductor package 68 of FIG. 4 is inverted. A flip chip style semiconductor die 80 has active and passive devices, conductive layers, and dielectric layers on its active surface according to the electrical design of the die. Semiconductor die 80 further includes contact pads 82 for routing signals to the circuits in the die. Contact pads 82 are electrically connected to UBMs 76 by solder bumps 84. A portion of UBMs 76 narrows or fans-in to a finer pitch to accommodate solder bumps 84, which are substantially smaller than solder bumps 78. In fact, the height of semiconductor die 80, as mounted on semiconductor package 68, is about 300 μm. The metallurgical bonding of solder bump 78 to another package reduces its height by about 30% or to about 350 μm, which provides about 50 μm of clearance for flip chip semiconductor die 80. An underfill material 90 is disposed under semiconductor die 80. The underfill material 90 can be made with epoxy, polymeric material, film, or other non-conductive material. The flip chip semiconductor die can be mounted on either side of semiconductor package 58 or 68.

Figure 6:
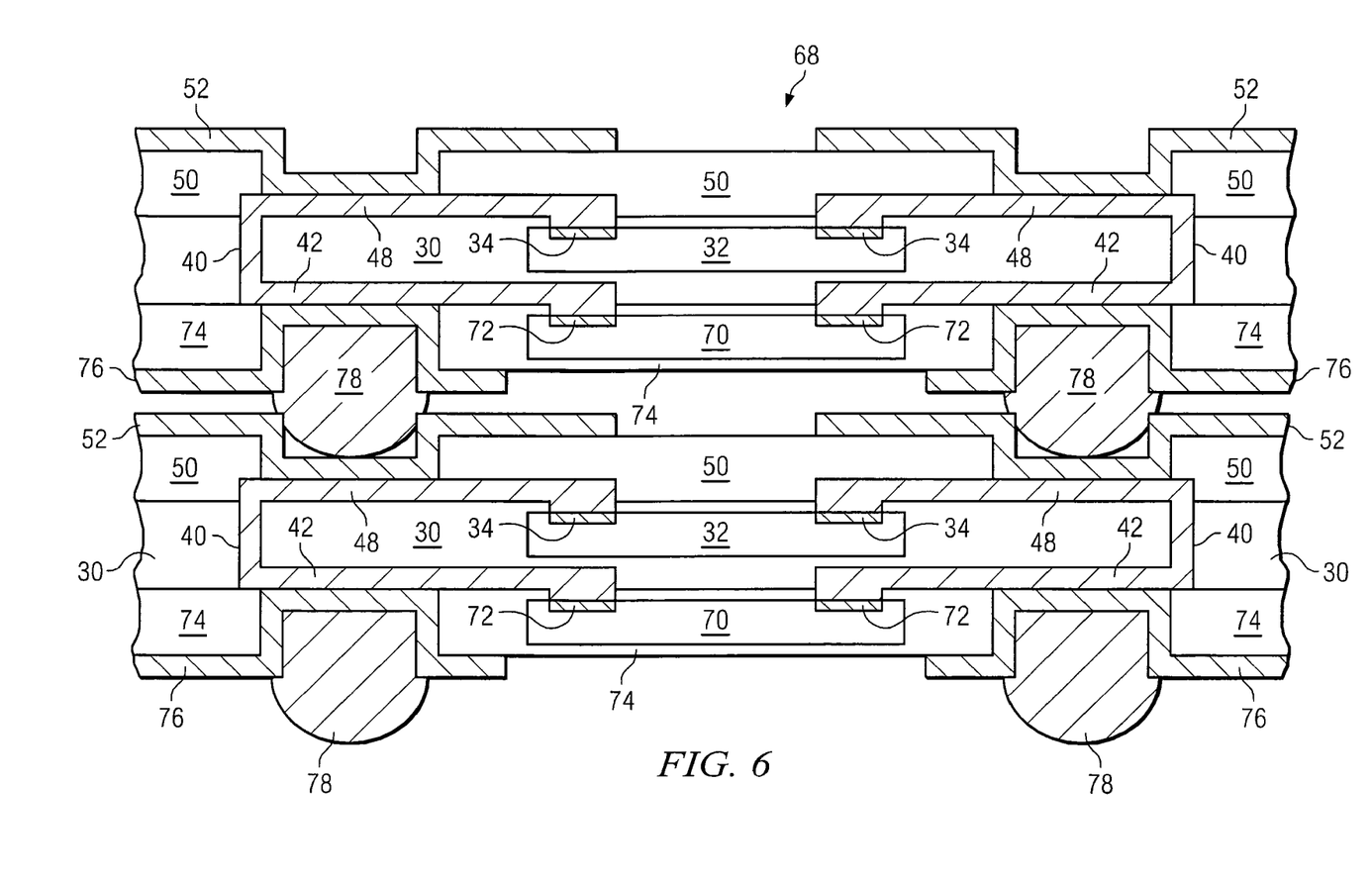
FIG. 6 illustrates stacked semiconductor packages using one solder bump.

FIG. 6 illustrates two stacked semiconductor packages like 68. The solder bumps 78 formed on UBMs 76 metallurgically bond to UBMs 52 on the adjacent semiconductor package, which has no solder bump. The stacked semiconductor packages use only one solder bump for interconnect, which reduces stacking height. Again, the vertical alignment of the top and bottom bonding pads simplifies the stacking arrangement of the semiconductor packages.

Figure 7:
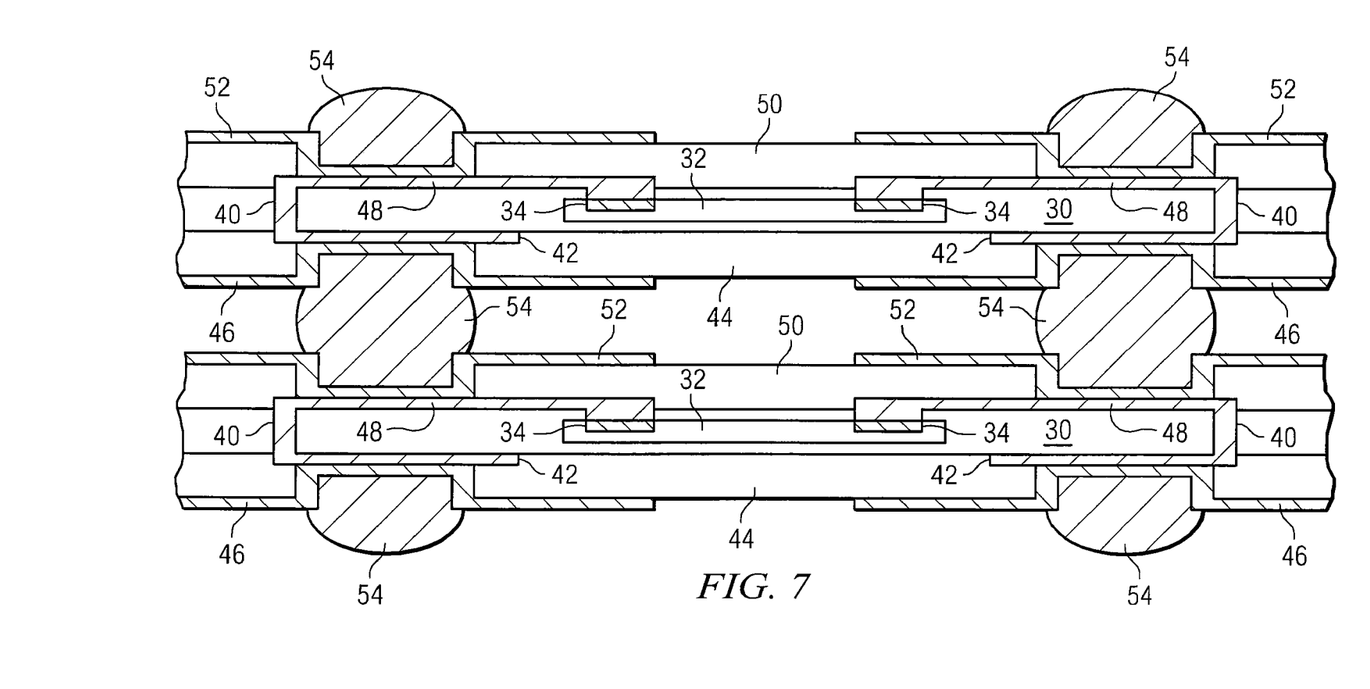
FIG. 7 illustrates stacked semiconductor packages using two solder bumps.

FIG. 7 illustrates two stacked semiconductor packages like 58. The solder bumps 54 formed on UBMs 46 metallurgically bond to solder bumps on UBMs 52 on adjacent semiconductor package. Again, the vertical alignment of the top and bottom bonding pads simplifies the stacking arrangement of the semiconductor packages.

Figure 8:
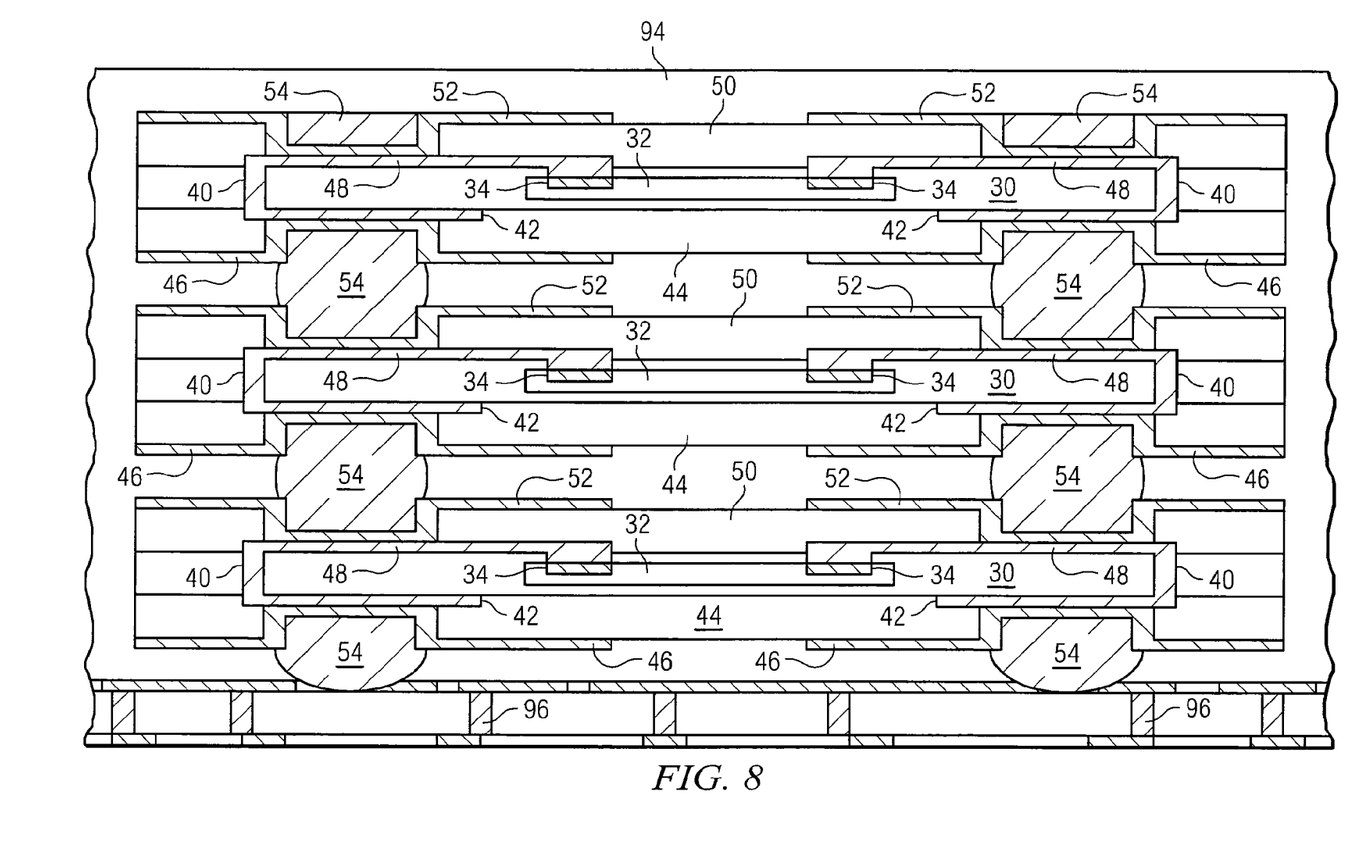
FIG. 8 illustrates stacked semiconductor packages in a laminate package with substrate having interconnect structure.
Figure 9:
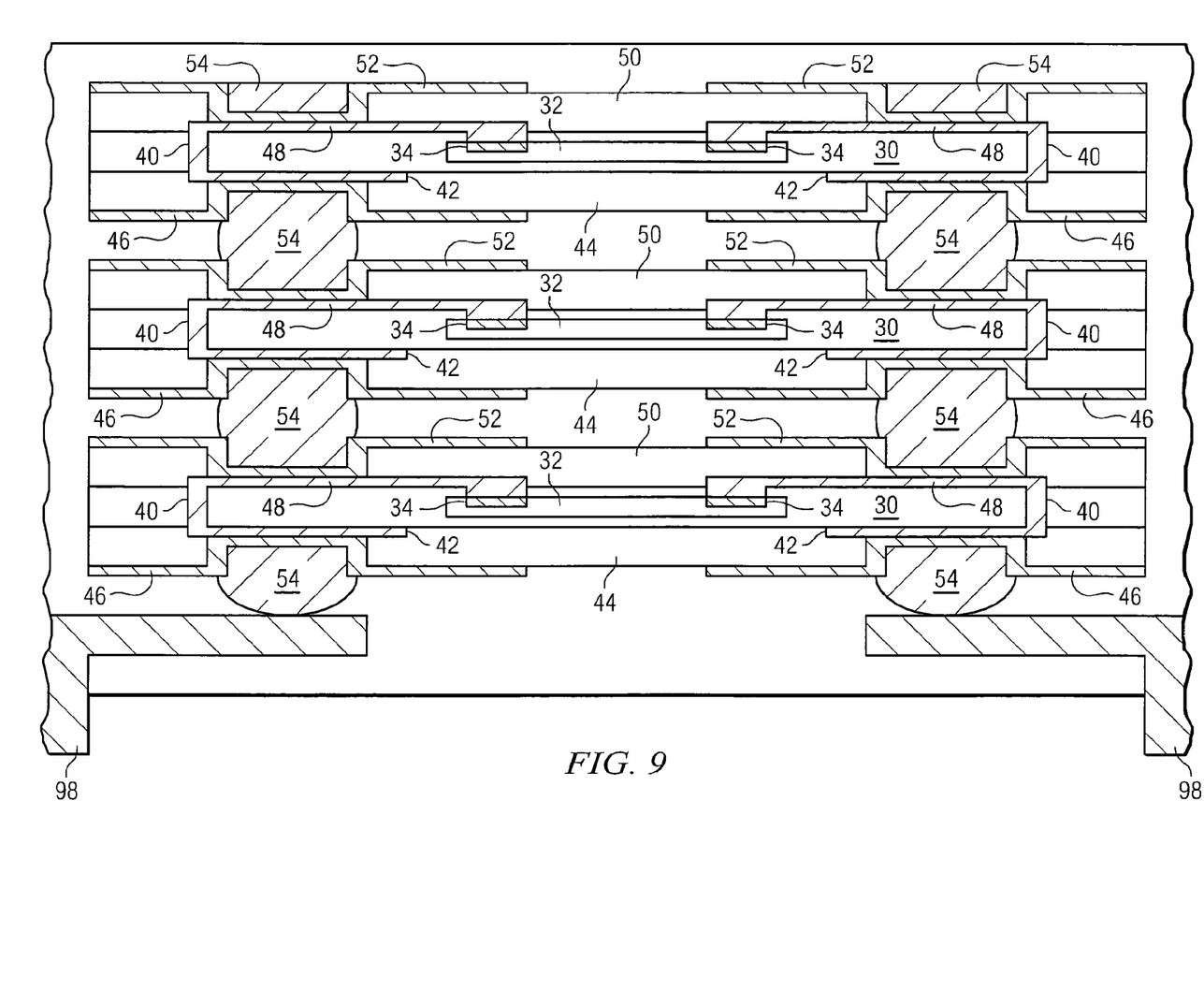
FIG. 9 illustrates stacked semiconductor packages in a leaded package.

FIG. 8 illustrates the stacked semiconductor packages in a laminate package 94 with a substrate having electrical interconnects 96. FIG. 9 illustrates stacked semiconductor packages with chip-on-lead formation in leaded package 98.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    a first semiconductor die;
    a plurality of conductive vias formed around the first semiconductor die;
    a first conductive layer formed over a first surface of the first semiconductor die and electrically connected to the plurality of conductive vias;
    a second conductive layer formed over a second surface of the first semiconductor die opposite the first surface and electrically connected to the plurality of conductive vias;
    a first insulating layer formed over the first surface of the first semiconductor die and including openings exposing the first conductive layer;
    a second insulating layer formed over the second surface of the first semiconductor die and including openings exposing the second conductive layer;
    a plurality of bonding pads formed within the openings in the first and second insulating layers; and
    an interconnect structure disposed within the openings in the first and second insulating layers.

2. The semiconductor device of claim 1, wherein the interconnect structure includes a bump or wire bond.

3. The semiconductor device of claim 1, further including a second semiconductor die disposed over the semiconductor device, wherein a height of the second semiconductor die is less than a height of the interconnect structure.

4. The semiconductor device of claim 1, wherein the openings in the first and second insulating layers are formed outside a footprint of the first semiconductor die.

5. The semiconductor device of claim 1, further including:
   a second semiconductor die disposed over the second surface of the first semiconductor die and electrically connected to the second conductive layer; and
   the second insulating layer formed over the second semiconductor die.

6. The semiconductor device of claim 1, further including a plurality of semiconductor devices stacked and electrically connected through the bonding pads.

7. A semiconductor device, comprising:
   a first semiconductor die;
   a first conductive layer formed over a first surface of the first semiconductor die;
   a second conductive layer formed over a second surface of the first semiconductor die opposite the first surface;
   a first insulating layer including a first opening formed over the first surface of the first semiconductor die;
   a second insulating layer including a second opening formed over the second surface of the first semiconductor die;
   a first bonding pad formed within the first opening of the first insulating layer;
   a second bonding pad formed within the second opening of the second insulating layer and aligned with the first bonding pad; and
   an interconnect structure disposed within the first and second openings of the first and second insulating layers.

8. The semiconductor device of claim 7, wherein the interconnect structure includes a bump or wire bond.

9. The semiconductor device of claim 7, further including a second semiconductor die disposed over the semiconductor device, wherein a height of the second semiconductor die is less than a height of the interconnect structure.

10. A semiconductor device, comprising:
    a first semiconductor die;
    a conductive via formed adjacent to the first semiconductor die;
    a first bonding pad formed over a first surface of the first semiconductor die and coupled to the conductive via;
    a first interconnect structure disposed in a recessed portion of the first bonding pad; and
    a second bonding pad formed over a second surface of the first semiconductor die and coupled to the conductive via with the second bonding pad vertically aligned with the recessed portion of the first bonding pad.

11. The semiconductor device of claim 10, further including a second interconnect structure disposed over the second bonding pad.

12. The semiconductor device of claim 10, further including a plurality of semiconductor devices stacked and electrically connected through the first and second bonding pads.

13. The semiconductor device of claim 10, further including:
    a first conductive layer formed over the first surface of the first semiconductor die;
    a second conductive layer formed over the second surface of the first semiconductor die;
    a first insulating layer including a first opening exposing the first conductive layer formed over the first surface of the first semiconductor die; and
    a second insulating layer including a second opening exposing the second conductive layer formed over the second surface of the first semiconductor die.

14. The semiconductor device of claim 11, further including a second semiconductor die disposed over the semiconductor device, wherein a height of the second semiconductor die is less than a height of the first interconnect structure.

15. The semiconductor device of claim 13, wherein the first bonding pad follows a contour of the first opening of the first insulating layer and the second bonding pad follows a contour of the second opening of the second insulating layer.

16. The semiconductor device of claim 13, further including a second semiconductor die disposed over the second surface of the first semiconductor die with the second insulating layer formed over the second semiconductor die.

17. The semiconductor device of claim 13, wherein the first bonding pad is formed within the first opening of the first insulating layer and the second bonding pad is formed within the second opening of the second insulating layer.

18. A semiconductor device, comprising:
    a first semiconductor die;
    a first conductive layer formed over a first surface of the first semiconductor die;
    a second conductive layer formed over a second surface of the first semiconductor die opposite the first surface;
    a plurality of conductive vias formed around the first semiconductor die and electrically connected to the first and second conductive layers
    a first insulating layer including a first opening formed over the first surface of the first semiconductor die;
    a second insulating layer including a second opening vertically aligned with the first opening of the first insulating layer and formed over the second surface of the first semiconductor die;
    a first bonding pad formed within the first opening of the first insulating layer; and
    a second bonding pad formed within the second opening of the second insulating layer.

19. The semiconductor device of claim 18, further including a second semiconductor die disposed over the second surface of the first semiconductor die with a portion of the second insulating layer disposed over the second semiconductor die.

20. The semiconductor device of claim 18, further including a plurality of semiconductor devices stacked and electrically connected through the first and second bonding pads.

* * * * *